(12) United States Patent
Aida et al.

(10) Patent No.: US 9,136,820 B2
(45) Date of Patent: Sep. 15, 2015

(54) PIEZOELECTRIC DEVICE

(75) Inventors: Yasuhiro Aida, Tokyo (JP); Katsuyuki Kurachi, Tokyo (JP); Hitoshi Sakuma, Tokyo (JP); Kazuhiko Maejima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 441 days.

(21) Appl. No.: 13/563,169

(22) Filed: Jul. 31, 2012

(65) Prior Publication Data

US 2014/0035440 A1 Feb. 6, 2014

(51) Int. Cl.

| | |
|---|---|
| *H01L 41/187* | (2006.01) |
| *C09K 5/00* | (2006.01) |
| *C04B 35/00* | (2006.01) |
| *H03H 9/02* | (2006.01) |
| *H01L 41/053* | (2006.01) |
| *H01L 41/08* | (2006.01) |
| *G01C 19/5783* | (2012.01) |
| *H01L 41/113* | (2006.01) |
| *G01P 15/00* | (2006.01) |
| *H04R 17/02* | (2006.01) |
| *H01L 41/09* | (2006.01) |

(52) U.S. Cl.
CPC ....... *H03H 9/02133* (2013.01); *G01C 19/5783* (2013.01); *H01L 41/0536* (2013.01); *H01L 41/0805* (2013.01); *H01L 41/0815* (2013.01); *G01P 15/00* (2013.01); *H01L 41/0973* (2013.01); *H01L 41/1132* (2013.01); *H04R 17/02* (2013.01)

(58) Field of Classification Search
CPC ... H01L 41/053; H01L 41/047; H01L 41/083; H01L 41/187; H01L 41/18; H01L 41/0926; H01L 41/22; H03H 3/02; H03H 3/04; H03H 9/1007; H03H 9/1021; F02M 61/167; G10K 11/004; C04B 35/46; C04B 35/48; C04B 35/50; C04B 35/51; C04B 35/4682; C04B 35/468; C04B 35/495; C04B 2235/3201; C04B 2235/3215; C04B 2235/3251; H01G 4/1227

USPC .................. 310/340, 346, 365, 358; 252/69; 501/134, 137

See application file for complete search history.

(56) References Cited

U.S. PATENT DOCUMENTS 4,523,122 A * 6/1985 Tone et al. ..................... 310/334
4,571,520 A * 2/1986 Saito et al. ..................... 310/327
(Continued)

FOREIGN PATENT DOCUMENTS

EP 2-086-031 A2 8/2009
JP 60-134617 * 7/1985 ............... H03H 9/17
(Continued)

OTHER PUBLICATIONS

U.S. Appl. No. 13/487,563, filed Jun. 4, 2012.
(Continued)

*Primary Examiner* — Thomas Dougherty
(74) *Attorney, Agent, or Firm* — Oliff PLC

(57) ABSTRACT

A piezoelectric device according to the present invention is provided with a pair of electrode films, a piezoelectric film sandwiched in between the pair of electrode films, and a stress control film which is in direct contact with a surface of at least one of the pair of electrode films, on the side where the electrode film is not in contact with the piezoelectric film, and which has a linear expansion coefficient larger than those of the relevant electrode film and the piezoelectric film.

14 Claims, 6 Drawing Sheets

(56) References Cited

U.S. PATENT DOCUMENTS

| | | | |
|---|---|---|---|
| 5,404,067 A * | 4/1995 | Stein et al. | 310/330 |
| 5,458,986 A | 10/1995 | Wilber et al. | |
| 6,121,611 A * | 9/2000 | Lindsay et al. | 850/59 |
| 7,901,800 B2 | 3/2011 | Shibata et al. | |
| 7,965,021 B2 | 6/2011 | Harigai et al. | |
| 8,102,100 B2 | 1/2012 | Hamada et al. | |
| 2002/0094457 A1 * | 7/2002 | Krusin-Elbaum et al. | 428/694 TM |
| 2004/0014326 A1 | 1/2004 | Din | |
| 2004/0129917 A1 * | 7/2004 | Kubota et al. | 252/62.9 R |
| 2005/0070043 A1 | 3/2005 | Yamakawa et al. | |
| 2005/0098816 A1 | 5/2005 | Baniecki et al. | |
| 2005/0151600 A1 * | 7/2005 | Takeuchi et al. | 333/191 |
| 2005/0184627 A1 | 8/2005 | Sano et al. | |
| 2006/0119226 A1 * | 6/2006 | Nihei | 310/341 |
| 2006/0138906 A1 | 6/2006 | Iwashita et al. | |
| 2006/0175639 A1 * | 8/2006 | Leidl et al. | 257/245 |
| 2006/0214542 A1 | 9/2006 | Iwashita et al. | |
| 2006/0258027 A1 * | 11/2006 | Ohmae et al. | 438/22 |
| 2008/0067898 A1 * | 3/2008 | Aoki et al. | 310/358 |
| 2008/0074005 A1 | 3/2008 | Sano et al. | |
| 2008/0203855 A1 * | 8/2008 | Viehland et al. | 310/357 |
| 2008/0248324 A1 | 10/2008 | Murayama et al. | |
| 2009/0007645 A1 * | 1/2009 | Shih et al. | 73/105 |
| 2009/0033177 A1 | 2/2009 | Itaya et al. | |
| 2009/0075066 A1 | 3/2009 | Shibata et al. | |
| 2009/0079797 A1 * | 3/2009 | Yokouchi | 347/63 |
| 2010/0097723 A1 | 4/2010 | Hata et al. | |
| 2010/0117493 A1 | 5/2010 | Hayashi et al. | |
| 2011/0062825 A1 * | 3/2011 | Kawahara | 310/344 |
| 2011/0109701 A1 | 5/2011 | Ohashi | |
| 2012/0032300 A1 | 2/2012 | Wang | |
| 2012/0206019 A1 | 8/2012 | Noda et al. | |
| 2013/0070029 A1 | 3/2013 | Mizukami et al. | |
| 2013/0147880 A1 | 6/2013 | Hamada et al. | |
| 2013/0250007 A1 | 9/2013 | Ishimori et al. | |
| 2013/0320813 A1 | 12/2013 | Kurachi et al. | |
| 2013/0320814 A1 * | 12/2013 | Sakuma et al. | 310/363 |
| 2014/0035440 A1 | 2/2014 | Aida et al. | |

FOREIGN PATENT DOCUMENTS

| | | | | |
|---|---|---|---|---|
| JP | 06-325972 A | * | 11/1994 | H01C 17/28 |
| JP | A-11-097755 | | 4/1999 | |
| JP | 2000-41298 | * | 2/2000 | H04R 71/00 |
| JP | A-2003-176176 | | 6/2003 | |
| JP | A-2006-100622 | | 4/2006 | |
| JP | A-2006-188414 | | 7/2006 | |
| JP | A-2006-286911 | | 10/2006 | |
| JP | A-2007-277606 | | 10/2007 | |
| JP | B2-4142128 | | 8/2008 | |
| JP | A-2008-211385 | | 9/2008 | |
| JP | A-2009-94449 | | 4/2009 | |
| JP | A-2010-103194 | | 5/2010 | |

OTHER PUBLICATIONS

Feb. 21, 2014 Office Action issued in U.S. Appl. No. 13/487,530.
U.S. Appl. No. 13/487,530, filed Jun. 4, 2012.
Yamadera, Hideya, "Measurement and Control of Thermal Stress in Thin Films," R&D Review of Toyota CRDL, vol. 34, No. 1, 1999, pp. 19-24 (with abstract).
May 14, 2013 Written Opinion of the International Searching Authority issued in International Application No. PCT/JP2013/063877.
May 14, 2013 International Search Report issued in International Application No. PCT/JP2013/063877.
Sep. 22, 2014 Office Action issued in U.S. Appl. No. 13/566,468.

* cited by examiner

PIEZOELECTRIC DEVICE

BACKGROUND OF THE INVENTION

1. Field of the Invention

The present invention relates to a piezoelectric device using a thin film piezoelectric material.

2. Related Background Art

Recently, practical application of piezoelectric devices using thin-film piezoelectric materials is spreading, in place of bulk piezoelectric materials. Examples of such application include gyro sensors, shock sensors, microphones, etc. making use of the piezoelectric effect to convert a force exerted on a piezoelectric film to a voltage, or actuators, ink jet heads, speakers, buzzers, resonators, etc. making use of the inverse piezoelectric effect to deform a piezoelectric film with application of voltage thereto.

Reduction in thickness of the piezoelectric material will enable reduction in scale of the piezoelectric device to expand fields of application. Since a large number of piezoelectric devices can be manufactured together on a substrate, mass productivity must increase. Furthermore, there are many advantages in terms of performance, e.g., improvement in sensitivity when the piezoelectric film is used in a sensor. However, external stress from other films to the piezoelectric film and internal stress of the piezoelectric film itself will bring about more influence on the piezoelectric characteristics than in the case of the bulk materials, and for this reason the piezoelectric thin film requires a stress control technology different from that for the bulk materials. Therefore, a control method of the piezoelectric characteristics with focus on control of thermal stress applied to interfaces of the piezoelectric film becomes an important factor in design of the piezoelectric device.

Patent Literature 1: Japanese Patent Application Laid-open No. 2003-176176

Patent Literature 2: Japanese Patent Application Laid-open No. 2006-188414

Patent Literature 3: Japanese Patent Application Laid-open No. 1999-097755

Patent Literature 4: Japanese Patent Application Laid-open No. 2006-100622

Patent Literature 5: Japanese Patent Application Laid-open No. 2009-094449

SUMMARY OF THE INVENTION

One of important factors among the piezoelectric characteristics is the coercive electric field Ec. The coercive electric field Ec is the magnitude of an electric field at reverse points of spontaneous polarization, and the polarization direction starts to reverse when an electric field over this coercive electric field is applied to the piezoelectric material. FIG. 1 shows a hysteresis curve of polarization P-electric field E of a typical piezoelectric device, and positions of coercive electric field Ec. In the case of a device making use of the reverse piezoelectric effect, i.e., deformation of the piezoelectric film with application of voltage, high displacement is achieved in the same direction as the polarization direction.

FIG. 2 shows a relation of strain x and electric field E of a typical piezoelectric device (which is called a butterfly curve). It is seen from FIG. 2 that the strain direction reverses at points of coercive electric field Ec. This means that even if the electric field E is increased in order to obtain a large strain x, the polarization direction will reverse just over the coercive electric field Ec, so as to result in failure in obtaining the strain x in a desired direction. Therefore, there are desires for a piezoelectric device with a large coercive electric field Ec to obtain a large strain x.

One of techniques to increase the coercive electric field is to change the composition of the piezoelectric film (Patent Literatures 1 and 2), but even in the case of the piezoelectric material of the same composition, when it is formed as a thin film, as described above, the coercive electric field changes significantly because of the external stress due to the film configuration of the device, the internal stress due to deposition conditions, and factors such as crystallinity and orientation of the piezoelectric film, and the control thereof is difficult. When the coercive electric field is increased by the change in the composition of the piezoelectric film itself, the piezoelectric constants of the piezoelectric film tend to decrease, and it is thus difficult to obtain a desired displacement.

There is another technique to efficiently drive the piezoelectric film with a small coercive electric field (Patent Literature 3), but it requires preliminary measurement of accurate values of the coercive electric field, which makes a drive circuit complicated and which increases the cost of the device.

Patent Literature 4 discloses the piezoelectric device in a structure in which an intermediate film with a larger linear expansion coefficient than that of the piezoelectric film is interposed between a vibrating plate and the piezoelectric film, in order to improve the piezoelectric characteristics. The provision of such film between the vibrating plate and the piezoelectric film is effective to reduction of tensile stress of the piezoelectric film and increase in spontaneous polarization and coercive electric field. However, the linear expansion coefficient of electrode films in contact with the piezoelectric device is not taken into consideration at all.

Patent Literature 5 discloses the piezoelectric device in a structure in which an intermediate film to produce stress in compressive directions in the piezoelectric film is provided between an electrode formed on a silicon substrate and the piezoelectric film, though the purpose thereof is different from that of the present invention. However, this intermediate film needs to be formed before deposition of the piezoelectric film. Therefore, in order to ensure the crystallinity of the piezoelectric film, the intermediate film is subject to great restrictions on heat resistance temperature and crystal structure and there is little freedom for selection of material, so as to result in failure in effective application of compressive stress.

The present invention has been accomplished in view of the problems of the above-described conventional technologies, and it is an object of the present invention to provide a piezoelectric device capable of increasing the coercive electric field of the piezoelectric device.

A piezoelectric device according to the present invention comprises a first electrode film, a piezoelectric film provided on the first electrode film, a second electrode film provided on the piezoelectric film, and a second stress control film provided on the second electrode film. The second stress control film is in direct contact with the second electrode film. A linear expansion coefficient of the second stress control film is larger than those of the second electrode film and the piezoelectric film.

In the piezoelectric device of this configuration, the second stress control film is formed on the second electrode film while the second electrode film base is heated up from room temperature, and after the formation, it is cooled to room temperature, whereby the second stress control film can exert a compressive stress on the piezoelectric film. Similarly, the compressive stress can also be exerted on the piezoelectric film in the following manner: after the formation of the second stress control film, the piezoelectric film and the second stress control film are heated up from room temperature and then cooled to room temperature.

The second stress control film can be a cured thermosetting resin. Since the cured thermosetting resin often has a linear expansion coefficient larger than the piezoelectric film and the electrode film, the compressive stress can be effectively exerted on the piezoelectric film even if it is formed at a relatively low temperature. When the thermosetting resin is cured, the compressive stress can be exerted on the piezoelectric film, not only by the linear expansion coefficient difference, but also by contraction during curing.

The second stress control film can be an inorganic oxide. Since the inorganic oxide has high heat resistance, it can be subjected to deposition at a higher temperature or a thermal treatment at a higher temperature as long as the temperature is not more than the melting point of the electrode film; as a result, it is easier to increase the compressive stress on the piezoelectric film.

The piezoelectric device according to the present invention can be constructed without a substrate to support the laminate body. In other words, specifically, there is no substrate 10 μm or more thick on a top surface of the second stress control film, and there is no substrate 10 μm or more thick on a bottom surface of the first electrode film, either.

When the piezoelectric device is constructed without such substrate, there are no constraints on the piezoelectric film from the substrate and thus a larger compressive stress can be exerted on the piezoelectric film.

The piezoelectric device can further comprise a first stress control film provided on a bottom surface of the first electrode film. This first stress control film is in direct contact with the first electrode film and the linear expansion coefficient of the first stress control film is larger than linear expansion coefficients of the first electrode film and the piezoelectric film.

When the stress control films are provided on the surfaces of the two electrodes without contact with the piezoelectric film, the compressive stress can be exerted more effectively on the piezoelectric film than in the case where the stress control film is provided on one side. When the piezoelectric film is sandwiched in between the stress control films on both sides, it becomes easier to suppress warpage of the entire device and to assemble the piezoelectric device.

In this case, the piezoelectric device can be configured as follows: there is no substrate 10 μm or more thick on the top surface of the second stress control film and there is no substrate 10 μm or more thick on a bottom surface of the first stress control film, either.

When the piezoelectric device is constructed without such substrate, there are no constraints on the piezoelectric film from the substrate and thus a larger compressive stress can be exerted on the piezoelectric film.

The piezoelectric device can include an intermediate film for improvement, for example, in the crystallinity and the piezoelectric characteristics of the piezoelectric film between films. An example of such substrate is a first support body used as an underlying layer for the piezoelectric device, or a second support body bonded to a top surface of the piezoelectric device formed on the first support body, which has the thickness of not less than about 10 μm and which has a self-supporting property. For example, it can be a silicon substrate, a glass substrate, or the like.

The piezoelectric device of the present invention can have the larger coercive electric field than the conventional piezoelectric devices.

DESCRIPTION OF THE PREFERRED EMBODIMENTS

Figure 1:
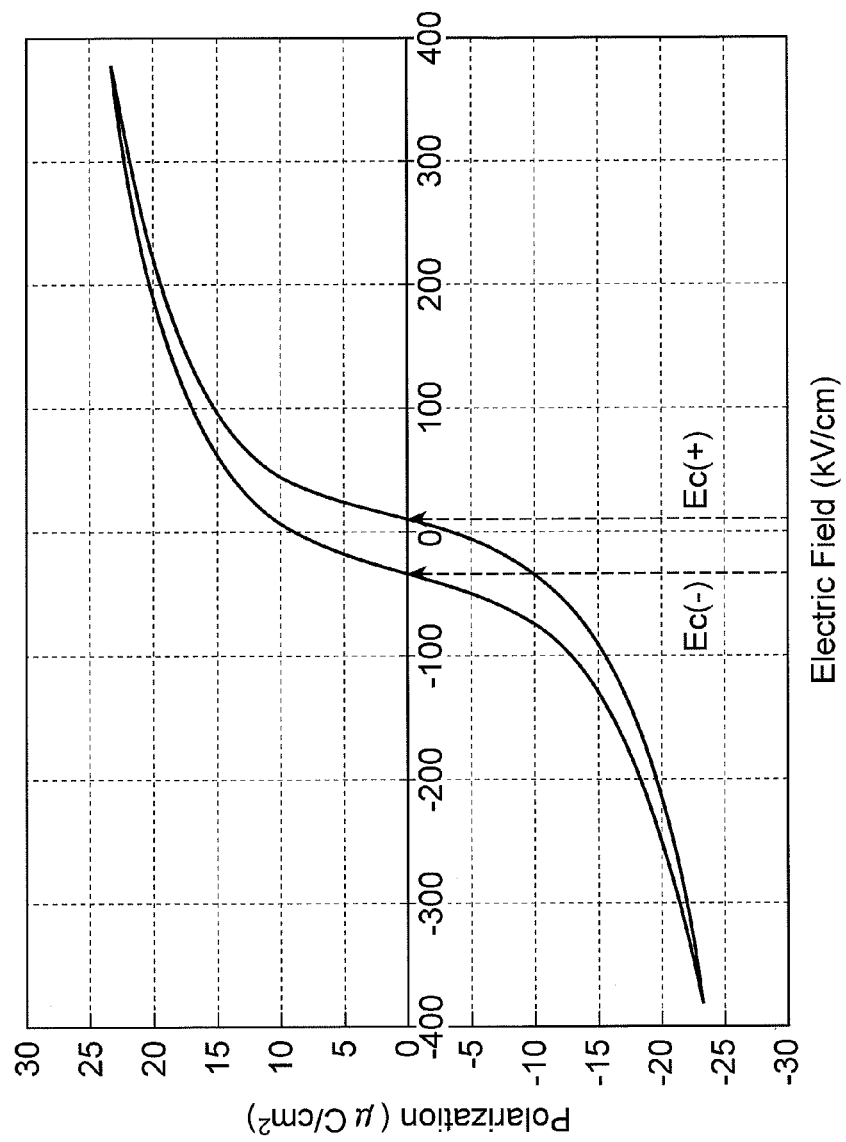
FIG. 1 is a drawing showing a hysteresis curve of polarization P-electric field E of a typical piezoelectric device, and positions of coercive electric field Ec.
Figure 2:
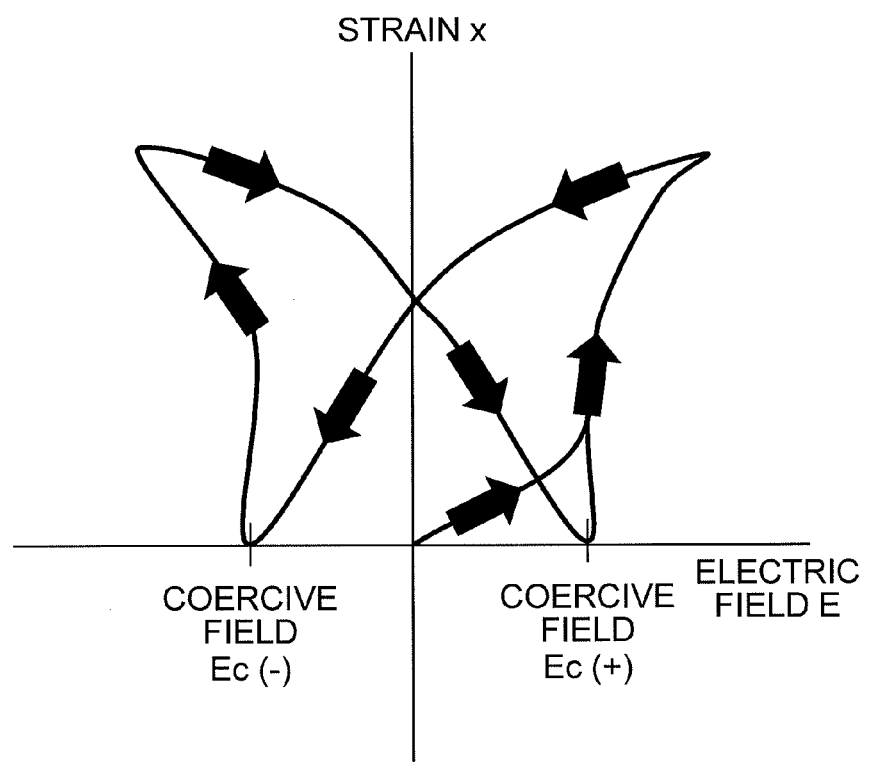
FIG. 2 is a drawing showing a relation of strain x and electric field E of a typical piezoelectric device (butterfly curve).

The preferred embodiments of the present invention will be described below in detail with reference to the drawings. In the drawings, identical or equivalent elements will be denoted by the same reference signs. The vertical and horizontal positional relations are as shown in the drawings. The description will be given without redundant description.

First Embodiment

Figure 3:
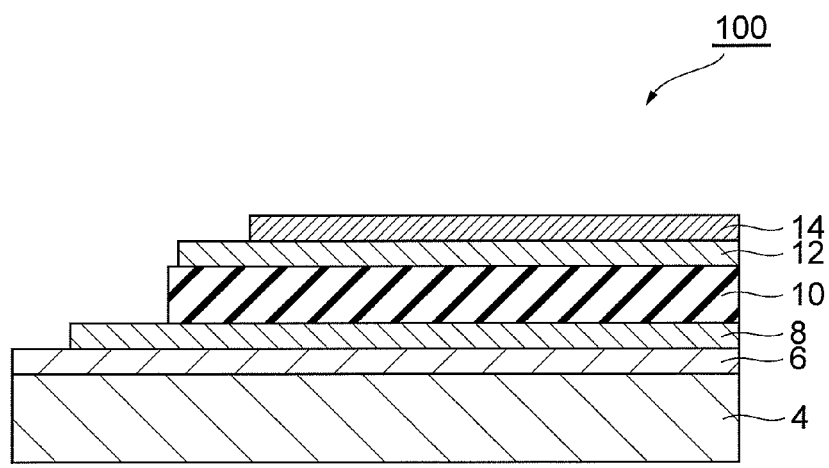
FIG. 3 is a schematic sectional view of a piezoelectric device according to the first embodiment of the present invention.

FIG. 3 shows a piezoelectric device 100 according to an embodiment of the present invention. The piezoelectric device 100 has a substrate 4, an insulating film 6 laid on the substrate 4, a first electrode film 8 laid on the insulating film 6, a piezoelectric film 10 formed on the first electrode film 8, a second electrode film 12 formed on the piezoelectric film 10, and a stress control film (second stress control film) 14 formed on the second electrode film 12.

(Substrate 4)

The substrate 4 to be used herein can be a silicon substrate having the (100) plane orientation. The substrate 4 can have the thickness, for example, in the range of 10 μm to 1000 μm. The substrate 4 to be used herein can also be a silicon substrate having a plane orientation different from the (100) plane, a Silicon-on-Insulator (SOI) substrate, a quartz glass substrate, a compound semiconductor substrate composed of GaAs or the like, a sapphire substrate, a metal substrate composed of stainless steel or the like, an MgO substrate, or an $SrTiO_3$ substrate. The thickness of the substrate 4 can be not less than 10 μm.

(Insulating Film 6)

The insulating film 6 is used when the substrate 4 is electrically conductive. When the substrate 4 is not electrically conductive, the piezoelectric device 100 may be constructed without the insulating film 6. The insulating film 6 to be used herein can be, for example, a thermally oxidized silicon film ($SiO_2$), $Si_3N_4$, $ZrO_2$, $Y_2O_3$, ZnO, or $Al_2O_3$. The thickness of the insulating film 6 can be in the range of 0.001 μm to 1.0 μm.

(First Electrode Film 8)

The first electrode film 8 is an electrically conductive film and is made, for example, of platinum (Pt). The first electrode film 8 can have the thickness, for example, in the range of 0.02 μm to 1.0 μm. When the first electrode film 8 is made of Pt, it is easier to form the piezoelectric film 10 with high orientation on the first electrode film 8. The first electrode film 8 to be used herein can also be a metal material such as palladium (Pd), rhodium (Rh), gold (Au), ruthenium (Ru), iridium (Ir), molybdenum (Mo), titanium (Ti), or tantalum (Ta), or an electroconductive metal oxide such as $SrRuO_3$ or $LaNiO_3$.

(Piezoelectric Film 10)

There are no particular restrictions on a material of the piezoelectric film 10 as long as it exhibits the piezoelectric characteristics; examples of such material include PZT (lead zirconate titanate), KNN (potassium sodium niobate), BT (barium titanate), LN (lithium niobate), BNT (bismuth sodium titanate), ZnO (zinc oxide), AlN (aluminum nitride), and so on. There are no particular restrictions on the thickness of the piezoelectric film 10, but the thickness can be, for example, in the range of about 0.5 μm to 10 μm.

(Second Electrode Film 12)

The second electrode film 12 is an electrically conductive film and can be made, for example, of platinum (Pt). The second electrode film 12 can have the thickness, for example, in the range of 0.02 μm to 1.0 μm. The second electrode film 12 to be used herein can also be a metal material such as palladium (Pd), rhodium (Rh), gold (Au), ruthenium (Ru), iridium (Ir), molybdenum (Mo), titanium (Ti), or tantalum (Ta), or an electroconductive metal oxide such as $SrRuO_3$ or $LaNiO_3$.

(Stress Control Film 14)

The linear expansion coefficient of the stress control film (second stress control film) 14 is larger than those of the second electrode film 12 and the piezoelectric film 10. The linear expansion coefficient in the present embodiment is an average of change rates of length against temperature (unit: 1/K), per unit length in the range of 20° C. to 500° C. When the materials of the respective films include those with a melting point of less than 500° C., the linear expansion coefficient in the present invention is defined as an average in the temperature range from 20° C. to a temperature 20° C. lower than the melting point of the material with the lowest melting point. The foregoing linear expansion coefficient of each film is determined by the laser flash method or by the X-ray reflectivity method, for a film deposited on a dummy silicon wafer put simultaneously during deposition of each film. It is generally known that the linear expansion coefficient of a thin film is close to a value of a bulk material, and if we know types of respective materials forming the piezoelectric device, a magnitude relation of the linear expansion coefficients of the respective films forming the device can be adequately estimated.

The linear expansion coefficient of the stress control film 14 is preferably larger by at least $0.1 \times 10^{-6}$ (1/K) than the larger value of the linear expansion coefficients of the second electrode film 12 and the piezoelectric film 10.

The material of the stress control film 14 to be used herein can be any material the linear expansion coefficient of which satisfies the above condition. Examples of materials applicable to the stress control film 14 include inorganic materials and resins. Examples of the inorganic materials include metals such as Pd, Co, Ni, Au, Cu, Ag, and Ti, alloys composed of elements selected from Ni, Fe, Co, Cr, Al, and Mg, and inorganic oxides such as $Nb_2O_5$, $Al_2O_3$, $Y_2O_3$, $TiO_2$, MgO, BaO, CaO, and SrO.

Particularly, the inorganic oxides have high heat resistance and for this reason, for example, in the temperature range of not more than the melting point of the electrodes, it is possible to perform deposition at a high temperature or a thermal treatment at a high temperature; as a result, it is easier to increase the compressive stress exerted on the piezoelectric film and thus to enhance the effect of increase in coercive electric field. If an inorganic oxide with high insulation is employed, a short of the device can be prevented.

Examples of the resins include cured thermosetting resins.

Since the cured thermosetting resins have the larger linear expansion coefficients than the piezoelectric film and the electrode film, they can effectively exert the compressive stress on the piezoelectric film, so as to enhance the effect of increase in coercive electric field. When a cured thermosetting resin is employed, the compressive stress can be exerted on the piezoelectric film, not only by thermal expansion but also by thermal contraction during curing, so as to enhance the effect of increase in coercive electric field. Therefore, even if the stress control film 14 is formed at a relatively low temperature, the compressive stress can be effectively exerted on the piezoelectric film, so as to enhance the effect of increase in coercive electric field. Furthermore, when a cured thermosetting resin with high insulation is employed, a short of the device can be prevented.

Examples of the thermosetting resins include polyurethane resin, urea resin, phenolic resin, melamine resin, polyimide resin, epoxy resin, unsaturated polyester resin, and silicone resin.

The thermosetting resins may contain an additive such as a filler or fiber as occasion may demand.

The thickness of the stress control film 14 is preferably larger than a total of the thicknesses of the second electrode film 12 and the piezoelectric film 10. As an example, the stress control film 14 can have the thickness in the range of 0.1 μm to 30 μm. When the stress control film 14 is thinner than 0.1 μm, the compressive stress on the piezoelectric film 10 tends to become smaller, so as to decrease the effect of increase in coercive electric field. When the stress control film 14 is thicker than 30 μm, a displacement can decrease because of increase in the total weight of the device.

(Stress on Film)

In the piezoelectric device 100, the stress control film 14 exerts the compressive stress on the piezoelectric film 10 in directions along the principal surface of the piezoelectric film 10. There are no particular restrictions on the magnitude of the compressive stress on the piezoelectric film 10, but it can be, for example, in the range of 10 to 200 MPa. Since the piezoelectric film 10 is subject to the compressive stress, the piezoelectric device 100 of the present embodiment can increase the coercive electric field. For this reason, the device can be driven under a high voltage and thus provide a larger displacement.

(Manufacturing Method)

An example of a manufacturing method of the above-described piezoelectric device will be described below.

First, the substrate 4 with the insulating film 6 on a surface thereof is prepared. The insulating film 6 can be formed on the substrate 4, for example, by sputtering, vacuum evaporation, thermal oxidation, printing, spin coating, or the sol-gel process. Subsequently, the first electrode film 8, piezoelectric film 10, and second electrode film 12 are formed in the order named, on the insulating film 6. Each of these films can be formed, for example, by sputtering, vacuum evaporation, printing, spin coating, or the sol-gel process.

Next, the stress control film 14 is formed on the second electrode film 12. The stress control film 14 can be formed, for example, by sputtering, vacuum evaporation, printing, chemical vapor deposition, spin coating, the sol-gel process, spray coating, or dip coating.

First, an example of a manufacturing method will be described where the stress control film 14 is an inorganic oxide.

The stress control film 14 of the inorganic oxide can be formed on the second electrode film 12, for example, by sputtering, vapor deposition, or chemical vapor deposition (CVD).

The stress control film 14 of the inorganic oxide is preferably deposited in a state in which the piezoelectric film 10 and the second electrode film 12 are heated at a temperature of not less than 200° C. and not more than 700° C. When the deposition is carried out at 200° C. or higher, the compressive stress is exerted on the piezoelectric film 10 during cooling to room temperature because of the difference of the linear expansion coefficients between the stress control film 14 and, the second electrode film 12 and piezoelectric film 10. When the deposition is carried out at the temperature of 700° C. or higher, diffusion of element and chemical reaction between the films can be controlled, which tends to successfully suppress degradation of the piezoelectric characteristics.

The stress control film of the inorganic oxide can be thermally treated at a temperature in the range of 200° C. to 700° C., after the deposition. When it is thermally treated again at 200° C. or higher, a larger compressive stress can be exerted on the piezoelectric film 10 because of the difference of the linear expansion coefficients between the stress control film 14 and, the second electrode film 12 and piezoelectric film 10. When the thermal treatment is carried out at the temperature of not more than 700° C., element diffusion and chemical reaction can be suppressed between the deposited films, which tends to successfully suppress the degradation of the piezoelectric characteristics. The temperature of the thermal treatment is preferably higher than the temperature during the deposition. This can exert a larger compressive stress on the piezoelectric film 10.

Next, an example of a manufacturing method will be described where the stress control film 14 is a cured thermosetting resin. First, a thermosetting resin film is formed on the second electrode film 12. The thermosetting resin film can be formed, for example, by spin coating, spray coating, dip coating, printing, or vacuum evaporation. Thereafter, the thermosetting resin film is thermally cured. This results in promoting polymerization, crosslinking reaction, etc. to cure the resin, thereby obtaining the stress control film 14. After the thermal curing, the stress control film can be further thermally treated.

The compressive stress on the piezoelectric film 10 from the stress control film 14 can be exerted by heating during the formation (thermal curing) of the stress control film 14 and a cooling process subsequent thereto. The compressive stress on the piezoelectric film 10 from the stress control film 14 can also be exerted by heating and cooling processes after the formation of the stress control film 14.

Since the stress control film 14 can be formed after the formation of the piezoelectric film 10 and the electrode film 12, there is no need for taking into consideration the orientation of the piezoelectric film 10, adherence to the piezoelectric film 10, the presence/absence of chemical reaction with the piezoelectric film, and the presence/absence of electrical conductivity, and thus the material of the stress control film can be selected from the materials that have high linear expansion coefficients and that can effectively exert the compressive stress on the piezoelectric film.

Second Embodiment

Figure 4:
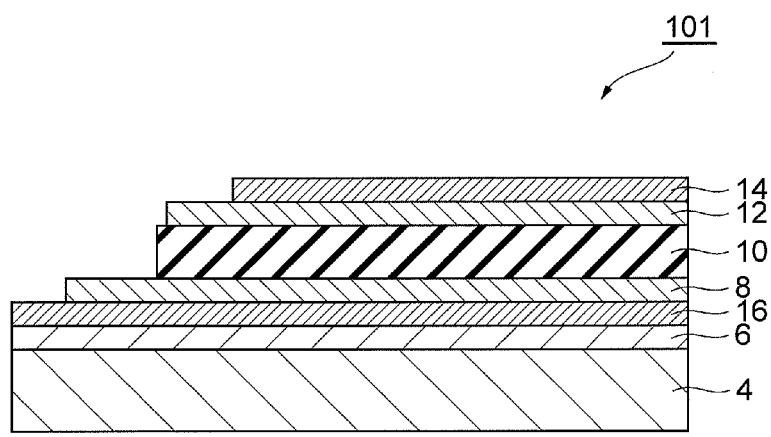
FIG. 4 is a schematic sectional view of a piezoelectric device according to the second embodiment of the present invention.

A piezoelectric device 101 according to the second embodiment will be described with reference to FIG. 4. The piezoelectric device 101 of the present embodiment is different from the piezoelectric device 100 of the first embodiment in that a stress control film (first stress control film) 16 is provided between the first electrode film 8 and the insulating film 6.

The linear expansion coefficient of the stress control film (first stress control film) 16 is larger than those of the first electrode film 8 and the piezoelectric film 10. The linear expansion coefficient of the stress control film 16 is preferably larger by at least $0.1 \times 10^{-6}$ (1/K) than the larger value of the linear expansion coefficients of the first electrode film 8 and the piezoelectric film 10.

The material of the stress control film 16 to be used herein can be any material the linear expansion coefficient of which satisfies the aforementioned condition. Examples of the material of the stress control film 16 and the thickness thereof can be the same as the examples and the range stated for the stress control film 14.

In the piezoelectric device 100, in addition to the stress control film 14, the stress control film 16 also exerts the compressive stress on the piezoelectric film 10 in the directions along the principal surface of the piezoelectric film 10. There are no particular restrictions on the magnitude of the compressive stress on the piezoelectric film 10, but it can be, for example, in the range of 10 to 200 MPa.

When the piezoelectric film 10 is sandwiched in between the stress control films 14, 16 on both outsides, it becomes easier to increase the compressive stress on the piezoelectric film 10 and to increase the coercive electric field. When the pair of electrode films 8, 12 are sandwiched in between the stress control films 14, 16 on both outsides, it is easier to prevent warpage of the entire device and to assemble the piezoelectric device.

The piezoelectric device 101 of this configuration can be manufactured in such a manner that in the manufacturing method of the piezoelectric device of the first embodiment, the stress control film 16 is formed in the same manner as the stress control film 14, before the formation of the first electrode film 8, and thereafter, the first electrode film 8, piezoelectric film 10, and second electrode film 12 are formed in a state in which the stress control film 16 is heated, for example, at a temperature in the range of 200° C. to 700° C.

Third Embodiment

Figure 5:
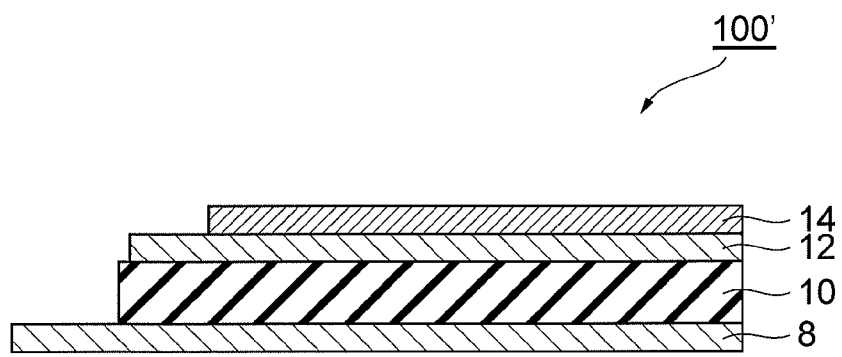
FIG. 5 is a schematic sectional view of a piezoelectric device according to the third embodiment of the present invention.

A piezoelectric device 100' according to the third embodiment will be described with reference to FIG. 5. The piezoelectric device 100' of the present embodiment is different from the piezoelectric device 100 of the first embodiment, in that the piezoelectric device 100' is constructed without the substrate 4 and the insulating film 6. Because of this configuration, the entire top surface of the stress control film 14 and the entire bottom surface of the first electrode film 8 are exposed to the outside. Since there are no constraints on expansion and compression by the substrate 4 in the piezoelectric device 100', the piezoelectric film 10 readily has a much greater compressive stress. This enhances the effect of increase in coercive electric field. Since the device becomes lighter in weight by the weight of the substrate 4, the device can have a greater displacement.

The piezoelectric device 100' of this configuration can be obtained by removing the substrate 4 and the insulating film 6 from the piezoelectric device 100 of the first embodiment by dry etching. The device may have a film such as the insulating film 6 on the bottom surface of the first electrode film 8 or on the top surface of the stress control film 14 if the thickness thereof is not more than 10 μm.

Fourth Embodiment

Figure 6:
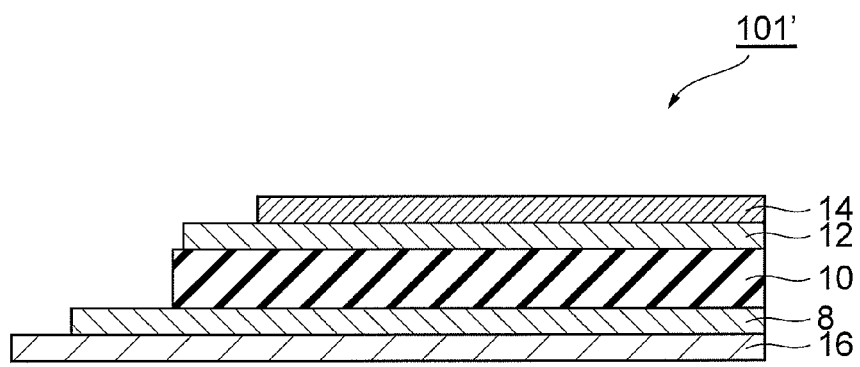
FIG. 6 is a schematic sectional view of a piezoelectric device according to the fourth embodiment of the present invention.

A piezoelectric device 101' according to the fourth embodiment will be described with reference to FIG. 6. The piezoelectric device 101' of the present embodiment is different from the piezoelectric device 101 of the second embodiment, in that the piezoelectric device 101' is constructed without the substrate 4 and the insulating film 6. Because of this configuration, the entire top surface of the stress control film 14 and the entire bottom surface of the stress control film 16 are exposed to the outside. Since there are no constraints on expansion and compression by the substrate 4 in the piezoelectric device 101', the piezoelectric film 10 readily has a much larger compressive stress. This enhances the effect of increase in coercive electric field. Since the device becomes lighter in weight by the weight of the substrate 4, the device can have a greater displacement.

The piezoelectric device 101' of this configuration can be obtained by removing the substrate 4 and the insulating film 6 from the piezoelectric device 101 of the second embodiment by dry etching. It can also be obtained by bonding the stress control film 14 of the piezoelectric device 100 of the first embodiment to a second support substrate, then removing the substrate 4 and the oxide film 6 by dry etching, then forming the stress control film 16 on the exposed first electrode film 8, and thereafter removing the second support substrate. The device may have a film such as the insulating film 6 on the bottom surface of the stress control film 16 and/or on the top surface of the stress control film 14 if the thickness thereof is not more than 10 μm.

The above detailed the preferred embodiments of the piezoelectric device of the present invention, but it should be noted that the present invention is by no means limited to the above embodiments.

For example, the piezoelectric device of the present invention is suitably applied to the piezoelectric devices making use of the piezoelectric effect, such as gyro sensors, shock sensors and microphones, or to the piezoelectric devices making use of the inverse piezoelectric effect, such as actuators, ink jet heads, speakers, buzzers and resonators, and it is particularly suitably applied to the piezoelectric devices making use of the inverse piezoelectric effect.

EXAMPLES

The present invention will be described below in more detail on the basis of examples and comparative examples, but it should be noted that the present invention is by no means limited to the examples below.

Example 1

In each of the examples below, "base" refers to a body to be deposited in each step. In each of steps, the same film was also individually deposited on a dummy Si wafer (hereinafter referred to as dummy substrate) with the diameter of 3 inches, for measurement of linear expansion coefficient.

A 3-inch-diameter Si wafer with a thermally oxidized film ($SiO_2$) was set in a vacuum chamber of an RF sputtering system, the interior thereof was evacuated to vacuum, and a Pt film was deposited as first electrode film 8. The temperature of the base during the deposition was 400° C. and the thickness of the first electrode film was 200 nm.

Thereafter, the base was moved to another chamber of the RF sputtering system and (K,Na)NbO$_3$ was deposited as piezoelectric film 10. A sputtering target used herein was a ($K_{0.5}Na_{0.5}$)NbO$_3$ sintered body. The temperature of the base during the deposition was 550° C. and the thickness of the piezoelectric film was 2000 nm.

Thereafter, the base was again moved to another chamber of the RF sputtering system, the interior thereof was evacuated to vacuum, and thereafter a Pt film was deposited as second electrode film 12. The temperature of the base during the deposition was 200° C. and the thickness of the second electrode film was 200 nm.

After the deposition of the second electrode film, the base was moved to another chamber of the RF sputtering system, the interior thereof was evacuated to vacuum, and thereafter a Pd film was deposited as second stress control film 14. The temperature of the base during the deposition was 200° C. and the thickness of the stress control film was 100 nm.

The linear expansion coefficients of the first electrode film 8, second electrode film 12, and piezoelectric film 10, which were deposited heretofore, were measured by the laser flash method, using the dummy substrates on which the individual films were formed. The linear expansion coefficients of the Pt films used as the first electrode film 8 and second electrode film 12 were $8.8\times10^{-6}$ (1/K) and the linear expansion coefficient of the (K,Na)NbO$_3$ film used as the piezoelectric film 10 was $8.0\times10^{-6}$ (1/K). The linear expansion coefficient of Pd used for the second stress control film 14 was $11.8\times10^{-6}$ (1/K). The linear expansion coefficient of the second stress control film 14 was larger than those of the first electrode film 8, the second electrode film 12, and the piezoelectric film 10.

After the formation of the second stress control film 14, the laminate body including the piezoelectric film 10 was patterned by photolithography, dry etching, and wet etching and the wafer was cut to obtain the piezoelectric device 100 with the size of movable part of 1 mm×2 mm.

Values P calculated from the below formula (which will be referred to hereinafter as stress control parameter P) are also provided in Tables 3 and 6.

Stress control parameter $P$=(linear expansion coefficient of first stress control film 16×thickness thereof+linear expansion coefficient of second stress control film 14×thickness thereof)−(linear expansion coefficient of piezoelectric film 10×thickness thereof+linear expansion coefficient of first electrode film 8×thickness thereof+linear expansion coefficient of second electrode film 12×thickness thereof).

Comparative Example 1

The piezoelectric device of Comparative Example 1 was obtained in the same manner as in Example 1, except that the device was constructed without the second stress control film 14.

Examples 2 to 7

The piezoelectric devices of Examples 2 to 7 were obtained in the same manner as in Example 1, except that the devices were manufactured using the substrate 4, insulating film 6, first electrode film 8, piezoelectric film 10, second electrode film 12, and second stress control film 14 provided in Tables 1 to 3.

Example 8

A 3-inch-diameter Si wafer with a thermally oxidized film ($SiO_2$) was set in a vacuum chamber of an RF sputtering system, the interior thereof was evacuated to vacuum, and a Pd film was deposited as first stress control film 16. The temperature of the base during the deposition was 400° C. and the thickness of the lower stress control film was 200 nm.

After the formation of the first stress control film 16, a Pt film was deposited as first electrode film 8. The temperature of the base during the deposition was 400° C. and the thickness of the lower stress control film was 200 nm. The piezoelectric device of Example 8 was obtained in the same manner as in Example 1 except for the above-described matter.

Example 9

A laminate body having the films up to the second stress control film 14 was formed on a silicon wafer 4 by the same method as in Example 1 (which will be referred to hereinafter as a deposited substrate). Thereafter, the second stress control film 14 of the deposited substrate was bonded through an adhesive film of an epoxy resin to another substrate with a thermally oxidized film on a silicon wafer (which will be referred to hereinafter as a support substrate).

After the bonding, the silicon wafer 4 and the thermally oxidized film 6 of the deposited substrate were removed by dry etching to expose the first electrode film 8.

Thereafter, the base was moved to the RF sputtering system and a Pd film was formed as first stress control film 16. The temperature of the base was 200° C. and the thickness of the lower stress control film was 200 nm.

After the formation of the first stress control film 16, the laminate body was patterned by photolithography, dry etching, and wet etching.

After the patterning, the support substrate and adhesive film were removed by dry etching to obtain the piezoelectric device of Example 9.

Comparative Example 2

The piezoelectric device of Comparative Example 2 was obtained in the same manner as in Example 9, except that the two stress control films were not provided.

Example 10

The piezoelectric device of Example 10 was obtained in the same manner as in Example 9, except that the first stress control film 16 and the second stress control film 14 were formed as described below. Specifically, a thermosetting polyurethane resin was applied onto each of the electrode films by spin coating. After the application, the thermosetting polyurethane resin films were pre-baked under the condition of 120° C. for 30 minutes and thereafter thermally cured under the condition of 250° C. for 60 minutes, thereby obtaining cured films of polyurethane resin.

Examples 11 to 17

The piezoelectric devices of Examples 11 to 17 were obtained in the same manner as in Example 10, except that the second stress control film 14 and the first stress control film 16 were made using the materials shown in Tables 1 to 3.

Example 18

The piezoelectric film 10 used herein was $Pb(Zr,Ti)O_3$. $Pb(Zr,Ti)O_3$ was deposited by RF sputtering. The temperature of the base during the deposition was 550° C.

$Nb_2O_5$ was used for the second stress control film 14 and the first stress control film 16. $Nb_2O_5$ was deposited by RF sputtering. The temperature of the base during the deposition was 200° C. The piezoelectric device of Example 18 was obtained in the same manner as in Example 9 except for the above-described matter.

Examples 19 to 25

The piezoelectric devices of Examples 19 to 25 were obtained in the same manner as in Example 18, except that the piezoelectric film 10, second stress control film 14, and first stress control film 16 were made using the materials shown in Tables 1 to 6.

Example 26

The piezoelectric device of Example 26 was obtained in the same manner as in Example 10, except that the piezoelectric film was made using the materials shown in Tables 4 to 6.

Examples 27 to 31

The piezoelectric devices of Examples 27 to 31 were obtained in the same manner as in Example 22, except that after removal of the support substrate, a thermal treatment was carried out at the temperatures shown in Tables 4 to 6, in the atmosphere for 60 minutes.

Example 32

The piezoelectric device of Examples 32 was obtained in the same manner as in Example 17, except that after removal of the support substrate, a thermal treatment was carried out at the temperature shown in Tables 4 to 6, in the atmosphere for 60 minutes.

Examples 33 to 43

The piezoelectric devices of Examples 33 to 43 were obtained in the same manner as in Example 32, except that the material, thickness, and thermal treatment temperature of the stress control films were changed to the conditions shown in Tables 4 to 6.

Tables 1 to 6 provide the materials used for the substrate 4, insulating film 6, first stress control film 16, first electrode film 8, piezoelectric film 10, second electrode film 12, and second stress control film 14, the linear expansion coefficients of the respective materials, and the thicknesses of the respective films in each of the examples and comparative examples.

TABLE 1

| | Substrate | | Insulating film | | 1st stress control film | | |
|---|---|---|---|---|---|---|---|
| | material | LEC $10^{-6}$ 1/K | material | LEC $10^{-6}$ 1/K | material | T nm | LEC $10^{-6}$ 1/K |
| Ex 1 | Si (100) | 2.6 | $SiO_2$ | 0.2 | no | 0 | 0.0 |
| C Ex 1 | Si (100) | 2.6 | $SiO_2$ | 0.2 | no | 0 | 0.0 |
| Ex 2 | Si (100) | 2.6 | $SiO_2$ | 0.2 | no | 0 | 0.0 |
| Ex 3 | Si (100) | 2.6 | $SiO_2$ | 0.2 | no | 0 | 0.0 |
| Ex 4 | Si (100) | 2.6 | $SiO_2$ | 0.2 | no | 0 | 0.0 |
| Ex 5 | Si (100) | 2.6 | $SiO_2$ | 0.2 | no | 0 | 0.0 |
| Ex 6 | Si (100) | 2.6 | $SiO_2$ | 0.2 | no | 0 | 0.0 |
| Ex 7 | Si (100) | 2.6 | $SiO_2$ | 0.2 | no | 0 | 0.0 |
| Ex 8 | Si (100) | 2.6 | $SiO_2$ | 0.2 | Pd | 100 | 11.8 |
| Ex 9 | no | | no | | Pd | 100 | 11.8 |
| C Ex 2 | no | | no | | no | 0 | 0.0 |
| Ex 10 | no | | no | | polyurethane | 100 | 120.0 |
| Ex 11 | no | | no | | urea resin | 100 | 25.0 |
| Ex 12 | no | | no | | phenolic resin | 100 | 30.0 |
| Ex 13 | no | | no | | melamine resin | 100 | 45.0 |
| Ex 14 | no | | no | | polyimide | 100 | 50.0 |
| Ex 15 | no | | no | | epoxy resin | 100 | 60.0 |
| Ex 16 | no | | no | | unsaturated polyester | 100 | 80.0 |
| Ex 17 | no | | no | | silicone resin | 100 | 250.0 |

TABLE 1-continued

| | Substrate | | Insulating film | | 1st stress control film | | |
|---|---|---|---|---|---|---|---|
| | material | LEC $10^{-6}$ 1/K | material | LEC $10^{-6}$ 1/K | material | T nm | LEC $10^{-6}$ 1/K |
| Ex 18 | no | | no | | $Nb_2O_5$ | 100 | 5.7 |
| Ex 19 | no | | no | | $Al_2O_3$ | 100 | 5.9 |

Ex: Example;
C Ex: Comparative Example;
LEC: linear expansion coefficient;
T: thickness

TABLE 2

| | 1st electrode film | | Piezoelectric film | | |
|---|---|---|---|---|---|
| | material | T nm | LEC $10^{-6}$ 1/K | material | T nm | LEC $10^{-6}$ 1/K |
| Ex 1 | Pt | 200 | 8.8 | $(K,Na)NbO_3$ | 2000 | 8.0 |
| C Ex 1 | Pt | 200 | 8.8 | $(K,Na)NbO_3$ | 2000 | 8.0 |
| Ex 2 | Pt | 200 | 8.8 | $(K,Na)NbO_3$ | 2000 | 8.0 |
| Ex 3 | Pt | 200 | 8.8 | $(K,Na)NbO_3$ | 2000 | 8.0 |
| Ex 4 | Pt | 200 | 8.8 | $(K,Na)NbO_3$ | 2000 | 8.0 |
| Ex 5 | Pt | 200 | 8.8 | $(K,Na)NbO_3$ | 2000 | 8.0 |
| Ex 6 | Pt | 200 | 8.8 | $(K,Na)NbO_3$ | 2000 | 8.0 |
| Ex 7 | Mo | 200 | 4.8 | $(K,Na)NbO_3$ | 2000 | 8.0 |
| Ex 8 | Pt | 200 | 8.8 | $(K,Na)NbO_3$ | 2000 | 8.0 |
| Ex 9 | Pt | 200 | 8.8 | $(K,Na)NbO_3$ | 2000 | 8.0 |
| C Ex 2 | Pt | 200 | 8.8 | $(K,Na)NbO_3$ | 2000 | 8.0 |
| Ex 10 | Pt | 200 | 8.8 | $(K,Na)NbO_3$ | 2000 | 8.0 |
| Ex 11 | Pt | 200 | 8.8 | $(K,Na)NbO_3$ | 2000 | 8.0 |
| Ex 12 | Pt | 200 | 8.8 | $(K,Na)NbO_3$ | 2000 | 8.0 |
| Ex 13 | Pt | 200 | 8.8 | $(K,Na)NbO_3$ | 2000 | 8.0 |
| Ex 14 | Pt | 200 | 8.8 | $(K,Na)NbO_3$ | 2000 | 8.0 |
| Ex 15 | Pt | 200 | 8.8 | $(K,Na)NbO_3$ | 2000 | 8.0 |
| Ex 16 | Pt | 200 | 8.8 | $(K,Na)NbO_3$ | 2000 | 8.0 |
| Ex 17 | Pt | 200 | 8.8 | $(K,Na)NbO_3$ | 2000 | 8.0 |
| Ex 18 | Mo | 200 | 4.8 | $Pb(Zr,Ti)O_3$ | 2000 | 5.3 |
| Ex 19 | Mo | 200 | 4.8 | $Pb(Zr,Ti)O_3$ | 2000 | 5.3 |

Ex: Example;
C: Ex Comparative Example;
LEC: linear expansion coefficient;
T: thickness

TABLE 3

| | 2nd electrode film | | | 2nd stress control film | | | | |
|---|---|---|---|---|---|---|---|---|
| | material | T nm | LEC $10^{-6}$ 1/K | material | T nm | LEC $10^{-6}$ 1/K | TT | SCP, P[—] |
| Ex 1 | Pt | 200 | 8.8 | Pd | 100 | 11.8 | no | −18340 |
| C Ex 1 | Pt | 200 | 8.8 | no | 0 | 0.0 | no | −19520 |
| Ex 2 | Pt | 200 | 8.8 | Co | 100 | 13.0 | no | −18220 |
| Ex 3 | Pt | 200 | 8.8 | Ni | 100 | 13.4 | no | −18180 |
| Ex 4 | Pt | 200 | 8.8 | Au | 100 | 14.2 | no | −18100 |
| Ex 5 | Pt | 200 | 8.8 | Cu | 100 | 16.5 | no | −17870 |
| Ex 6 | Pt | 200 | 8.8 | Ag | 100 | 18.9 | no | −17630 |
| Ex 7 | Mo | 200 | 4.8 | Ti | 100 | 8.6 | no | −17060 |
| Ex 8 | Pt | 200 | 8.8 | Pd | 100 | 11.8 | no | −17160 |
| Ex 9 | Pt | 200 | 8.8 | Pd | 100 | 11.8 | no | −17160 |
| C Ex 2 | Pt | 200 | 8.8 | no | 0 | 0.0 | no | −19520 |
| Ex 10 | Pt | 200 | 8.8 | polyurethane | 100 | 120.0 | no | 4480 |
| Ex 11 | Pt | 200 | 8.8 | urea resin | 100 | 25.0 | no | −14520 |
| Ex 12 | Pt | 200 | 8.8 | phenolic resin | 100 | 30.0 | no | −13520 |
| Ex 13 | Pt | 200 | 8.8 | melamine resin | 100 | 45.0 | no | −10520 |
| Ex 14 | Pt | 200 | 8.8 | polyimide | 100 | 50.0 | no | −9520 |
| Ex 15 | Pt | 200 | 8.8 | epoxy resin | 100 | 60.0 | no | −7520 |
| Ex 16 | Pt | 200 | 8.8 | unsaturated polyester | 100 | 80.0 | no | −3520 |
| Ex 17 | Pt | 200 | 8.8 | silicone | 100 | 250.0 | no | 30480 |
| Ex 18 | Mo | 200 | 4.8 | $Nb_2O_5$ | 100 | 5.7 | no | −11380 |
| Ex 19 | Mo | 200 | 4.8 | $Al_2O_3$ | 100 | 5.9 | no | −11340 |

Ex: Example;
C Ex: Comparative Example;
LEC: linear expansion coefficient;
T: thickness;
SCP: stress control parameter;
TT: Thermal treatment

TABLE 4

| | Substrate | | Insulating film | | 1st stress control film | | |
|---|---|---|---|---|---|---|---|
| | material | LEC $10^{-6}$ 1/K | material | LEC $10^{-6}$ 1/K | material | T nm | LEC $10^{-6}$ 1/K |
| Ex 20 | no | | no | | $Y_2O_3$ | 100 | 7.3 |
| Ex 21 | no | | no | | $TiO_2$ | 100 | 8.8 |
| Ex 22 | no | | no | | MgO | 100 | 10.5 |
| Ex 23 | no | | no | | BaO | 100 | 12.8 |
| Ex 24 | no | | no | | CaO | 100 | 12.9 |
| Ex 25 | no | | no | | SrO | 100 | 13.7 |
| Ex 26 | no | | no | | polyurethane | 100 | 120.0 |
| Ex 27 | no | | no | | MgO | 100 | 10.5 |
| Ex 28 | no | | no | | MgO | 100 | 10.5 |
| Ex 29 | no | | no | | MgO | 100 | 10.5 |
| Ex 30 | no | | no | | MgO | 100 | 10.5 |
| Ex 31 | no | | no | | MgO | 100 | 10.5 |
| Ex 32 | no | | no | | silicone resin | 100 | 250.0 |
| Ex 33 | no | | no | | silicone resin | 1000 | 250.0 |
| Ex 34 | no | | no | | silicone resin | 10000 | 250.0 |
| Ex 35 | no | | no | | silicone resin | 20000 | 250.0 |
| Ex 36 | no | | no | | silicone resin | 30000 | 250.0 |
| Ex 37 | no | | no | | silicone resin | 35000 | 250.0 |
| Ex 38 | no | | no | | silicone resin | 40000 | 250.0 |
| Ex 39 | no | | no | | MgO | 30 | 10.5 |
| Ex 40 | no | | no | | MgO | 60 | 10.5 |
| Ex 41 | no | | no | | MgO | 150 | 10.5 |
| Ex 42 | no | | no | | MgO | 1000 | 10.5 |
| Ex 43 | no | | no | | MgO | 2000 | 10.5 |

Ex Example;
LEC linear expansion coefficient;
T thickness

TABLE 5

| | 1st electrode film | | | Piezoelectric film | | |
|---|---|---|---|---|---|---|
| | material | T nm | LEC $10^{-6}$ 1/K | material | T nm | LEC $10^{-6}$ 1/K |
| Ex 20 | Mo | 200 | 4.8 | $Pb(Zr,Ti)O_3$ | 2000 | 5.3 |
| Ex 21 | Mo | 200 | 4.8 | $Pb(Zr,Ti)O_3$ | 2000 | 5.3 |

TABLE 5-continued

| | 1st electrode film | | | Piezoelectric film | | |
|---|---|---|---|---|---|---|
| | material | T nm | LEC $10^{-6}$ 1/K | material | T nm | LEC $10^{-6}$ 1/K |
| Ex 22 | Pt | 200 | 8.8 | (K,Na)NbO$_3$ | 2000 | 8.0 |
| Ex 23 | Pt | 200 | 8.8 | (K,Na)NbO$_3$ | 2000 | 8.0 |
| Ex 24 | Pt | 200 | 8.8 | (K,Na)NbO$_3$ | 2000 | 8.0 |
| Ex 25 | Pt | 200 | 8.8 | (K,Na)NbO$_3$ | 2000 | 8.0 |
| Ex 26 | Pt | 200 | 8.8 | BaTiO$_3$ | 2000 | 12.5 |
| Ex 27 | Pt | 200 | 8.8 | (K,Na)NbO$_3$ | 2000 | 8.0 |
| Ex 28 | Pt | 200 | 8.8 | (K,Na)NbO$_3$ | 2000 | 8.0 |
| Ex 29 | Pt | 200 | 8.8 | (K,Na)NbO$_3$ | 2000 | 8.0 |
| Ex 30 | Pt | 200 | 8.8 | (K,Na)NbO$_3$ | 2000 | 8.0 |
| Ex 31 | Pt | 200 | 8.8 | (K,Na)NbO$_3$ | 2000 | 8.0 |
| Ex 32 | Pt | 200 | 8.8 | (K,Na)NbO$_3$ | 2000 | 8.0 |
| Ex 33 | Pt | 200 | 8.8 | (K,Na)NbO$_3$ | 2000 | 8.0 |
| Ex 34 | Pt | 200 | 8.8 | (K,Na)NbO$_3$ | 2000 | 8.0 |
| Ex 35 | Pt | 200 | 8.8 | (K,Na)NbO$_3$ | 2000 | 8.0 |
| Ex 36 | Pt | 200 | 8.8 | (K,Na)NbO$_3$ | 2000 | 8.0 |
| Ex 37 | Pt | 200 | 8.8 | (K,Na)NbO$_3$ | 2000 | 8.0 |
| Ex 38 | Pt | 200 | 8.8 | (K,Na)NbO$_3$ | 2000 | 8.0 |
| Ex 39 | Pt | 200 | 8.8 | (K,Na)NbO$_3$ | 2000 | 8.0 |
| Ex 40 | Pt | 200 | 8.8 | (K,Na)NbO$_3$ | 2000 | 8.0 |
| Ex 41 | Pt | 200 | 8.8 | (K,Na)NbO$_3$ | 2000 | 8.0 |
| Ex 42 | Pt | 200 | 8.8 | (K,Na)NbO$_3$ | 2000 | 8.0 |
| Ex 43 | Pt | 200 | 8.8 | (K,Na)NbO$_3$ | 2000 | 8.0 |

Ex: Example;
LEC: linear expansion coefficient;
T thickness

TABLE 6

| | 2nd electrode film | | | 2nd stress control film | | | | |
|---|---|---|---|---|---|---|---|---|
| | material | T nm | LEC $10^{-6}$ 1/K | material | T nm | LEC $10^{-6}$ 1/K | TT | SCP, P[—] |
| Ex 20 | Mo | 200 | 4.8 | Y$_2$O$_3$ | 100 | 7.3 | no | −11060 |
| Ex 21 | Pt | 200 | 8.8 | TiO$_2$ | 100 | 8.8 | no | −11560 |
| Ex 22 | Pt | 200 | 8.8 | MgO | 100 | 10.5 | no | −17420 |
| Ex 23 | Pt | 200 | 8.8 | BaO | 100 | 12.8 | no | −16960 |
| Ex 24 | Pt | 200 | 8.8 | CaO | 100 | 12.9 | no | −16940 |
| Ex 25 | Pt | 200 | 8.8 | SrO | 100 | 13.7 | no | −16780 |
| Ex 26 | Pt | 200 | 8.8 | polyurethane | 100 | 120.0 | no | −4520 |
| Ex 27 | Pt | 200 | 8.8 | MgO | 100 | 10.5 | 150° C. | −17420 |
| Ex 28 | Pt | 200 | 8.8 | MgO | 100 | 10.5 | 250° C. | −17420 |
| Ex 29 | Pt | 200 | 8.8 | MgO | 100 | 10.5 | 500° C. | −17420 |
| Ex 30 | Pt | 200 | 8.8 | MgO | 100 | 10.5 | 680° C. | −17420 |
| Ex 31 | Pt | 200 | 8.8 | MgO | 100 | 10.5 | 750° C. | −17420 |
| Ex 32 | Pt | 200 | 8.8 | silicone resin | 100 | 250.0 | 150° C. | 30480 |
| Ex 33 | Pt | 200 | 8.8 | silicone resin | 1000 | 250.0 | 150° C. | 480480 |
| Ex 34 | Pt | 200 | 8.8 | silicone resin | 10000 | 250.0 | 150° C. | 4980480 |
| Ex 35 | Pt | 200 | 8.8 | silicone resin | 20000 | 250.0 | 150° C. | 9980480 |
| Ex 36 | Pt | 200 | 8.8 | silicone resin | 30000 | 250.0 | 150° C. | 14980480 |
| Ex 37 | Pt | 200 | 8.8 | silicone resin | 35000 | 250.0 | 150° C. | 17480480 |
| Ex 38 | Pt | 200 | 8.8 | silicone resin | 40000 | 250.0 | 150° C. | 19980480 |
| Ex 39 | Pt | 200 | 8.8 | MgO | 30 | 10.5 | 680° C. | −18890 |
| Ex 40 | Pt | 200 | 8.8 | MgO | 60 | 10.5 | 680° C. | −18260 |
| Ex 41 | Pt | 200 | 8.8 | MgO | 150 | 10.5 | 680° C. | −16370 |
| Ex 42 | Pt | 200 | 8.8 | MgO | 1000 | 10.5 | 680° C. | 1480 |
| Ex 43 | Pt | 200 | 8.8 | MgO | 2000 | 10.5 | 680° C. | 22480 |

Ex: Example;
LEC: linear expansion coefficient,
T: thickness;
TT: Thermal treatment;
SCP: stress control parameter (Evaluation of Coercive Electric Field and Displacement)

The piezoelectric characteristics of the respective piezoelectric devices of Examples 1 to 43 and Comparative Examples 1 and 2 were evaluated using a ferroelectric evaluation system TF-1000 (available from aixACCT). Displacements with application of voltage to the respective piezoelectric devices were measured using a laser Doppler vibrometer (available from GRAPHTEC corporation).

P-E hysteresis curves were measured by connecting the first electrode film to the positive electrode and the second electrode film to the negative electrode and applying a triangular wave of ±60 V with the frequency of 1 kHz, values of coercive electric fields Ec and Vc were obtained therefrom, and the results are provided in Tables 7 and 8 below. Values of displacements were measured similarly by connecting the first electrode film to the positive electrode and the second electrode film to the negative electrode and applying a voltage of a sinusoidal wave (±8 V or ±11 V) with the frequency of 1 kHz, and the results are provided in Tables 7 and 8.

TABLE 7

| | Coercive Field Ec+ (kV/cm) | Coercive Field Ec− (kV/cm) | Coercive Field Vc+ (V) | Coercive Field Vc− (V) | D (μm) (sine wave ±7 V) | D (μm) (sine wave ±11 V) |
|---|---|---|---|---|---|---|
| C Ex 1 | 8.9 | −32.8 | 1.8 | −6.6 | 0.22 | 0.33 |
| Ex 1 | 10.9 | −41.3 | 2.2 | −8.3 | 1.00 | 1.19 |

TABLE 7-continued

| | Coercive Field Ec+ (kV/cm) | Coercive Field Ec− (kV/cm) | Coercive Field Vc+ (V) | Coercive Field Vc− (V) | D (μm) (sine wave ±7 V) | D (μm) (sine wave ±11 V) |
| --- | --- | --- | --- | --- | --- | --- |
| Ex 2 | 11.3 | −42.5 | 2.3 | −8.5 | 1.10 | 1.30 |
| Ex 3 | 12.4 | −44.0 | 2.5 | −8.8 | 1.16 | 1.37 |
| Ex 4 | 12.4 | −46.0 | 2.5 | −9.2 | 1.18 | 1.40 |
| Ex 5 | 12.8 | −47.0 | 2.6 | −9.4 | 1.24 | 1.47 |
| Ex 6 | 13.5 | −48.9 | 2.7 | −9.8 | 1.26 | 1.49 |
| Ex 7 | 15.1 | −50.0 | 3.0 | −10.0 | 1.28 | 1.52 |
| Ex 8 | 16.2 | −54.5 | 3.2 | −10.9 | 1.28 | 1.54 |
| C Ex 2 | 9.9 | −34.7 | 2.0 | −6.9 | 0.24 | 0.30 |
| Ex 9 | 20.2 | −60.4 | 4.0 | −12.1 | 4.48 | 6.71 |
| Ex 10 | 45.0 | −110.9 | 9.0 | −22.2 | 4.80 | 7.21 |
| Ex 11 | 26.1 | −70.9 | 5.2 | −14.2 | 4.52 | 6.75 |
| Ex 12 | 28.7 | −74.5 | 5.7 | −14.9 | 4.60 | 6.91 |
| Ex 13 | 30.4 | −77.7 | 6.1 | −15.5 | 4.60 | 6.90 |
| Ex 14 | 32.0 | −80.8 | 6.4 | −16.2 | 4.65 | 7.00 |
| Ex 15 | 33.8 | −81.0 | 6.8 | −16.2 | 4.66 | 7.01 |
| Ex 16 | 34.0 | −83.0 | 6.8 | −16.6 | 4.56 | 6.99 |
| Ex 17 | 60.0 | −123.9 | 12.0 | −24.8 | 4.91 | 7.40 |
| Ex 18 | 110.4 | −210.5 | 22.1 | −42.1 | 5.21 | 7.80 |
| Ex 19 | 113.4 | −215.0 | 22.7 | −43.0 | 5.31 | 7.95 |

Ex: Example;
C Ex: Comparative Example;
D: displacement

TABLE 8

| | Coercive Field Ec+ (kV/cm) | Coercive Field Ec− (kV/cm) | Coercive Field Vc+ (V) | Coercive Field Vc− (V) | D (μm) (sine wave ±7 V) | D (μm) (sine wave ±11 V) |
| --- | --- | --- | --- | --- | --- | --- |
| Ex 20 | 114.8 | −218.2 | 23.0 | −43.6 | 5.40 | 8.05 |
| Ex 21 | 115.9 | −219.0 | 23.2 | −43.8 | 5.41 | 8.20 |
| Ex 22 | 22.5 | −57.1 | 4.5 | −11.4 | 4.55 | 6.87 |
| Ex 23 | 24.5 | −58.7 | 4.9 | −11.7 | 4.59 | 6.90 |
| Ex 24 | 25.1 | −59.8 | 5.0 | −12.0 | 4.61 | 6.90 |
| Ex 25 | 26.2 | −61.1 | 5.2 | −12.2 | 4.59 | 6.88 |
| Ex 26 | 30.4 | −62.4 | 6.1 | −12.5 | 4.55 | 7.15 |
| Ex 27 | 24.5 | −56.1 | 4.9 | −11.2 | 4.60 | 7.23 |
| Ex 28 | 28.2 | −61.3 | 5.6 | −12.3 | 4.70 | 7.38 |
| Ex 29 | 36.1 | −70.5 | 7.2 | −14.1 | 4.76 | 7.50 |
| Ex 30 | 40.9 | −74.5 | 8.2 | −14.9 | 4.78 | 7.52 |
| Ex 31 | 23.1 | −60.9 | 4.6 | −12.2 | 4.66 | 7.31 |
| Ex 32 | 72.1 | −130.9 | 14.4 | −26.2 | 4.02 | 6.30 |
| Ex 33 | 74.2 | −134.0 | 14.8 | −26.8 | 5.39 | 8.18 |
| Ex 34 | 75.6 | −136.0 | 15.1 | −27.2 | 5.25 | 7.98 |
| Ex 35 | 78.0 | −140.1 | 15.6 | −28.0 | 5.01 | 7.70 |
| Ex 36 | 80.1 | −145.2 | 16.0 | −29.0 | 4.90 | 7.55 |
| Ex 37 | 82.2 | −148.2 | 16.4 | −29.6 | 4.61 | 6.99 |
| Ex 38 | 83.5 | −150.1 | 16.7 | −30.0 | 4.50 | 6.61 |
| Ex 39 | 20.5 | −55.5 | 4.1 | −11.1 | 4.98 | 7.82 |
| Ex 40 | 21.1 | −59.0 | 4.2 | −11.8 | 4.95 | 7.79 |
| Ex 41 | 26.0 | −62.0 | 5.2 | −12.4 | 4.77 | 7.51 |
| Ex 42 | 35.9 | −69.5 | 7.2 | −13.9 | 4.67 | 7.32 |
| Ex 43 | 43.3 | −80.9 | 8.7 | −16.2 | 4.65 | 7.31 |

Ex: Example;
D: displacement

It was confirmed that the coercive electric fields Ec+, Vc+ and the coercive electric fields Ec−, Vc− of the piezoelectric devices of Examples 1 to 43 with the stress control film or films the linear expansion coefficient of which was larger than those of the electrode film and the piezoelectric film were larger than the coercive electric fields Ec+, Vc+ and the coercive electric fields Ec−, Vc− of Comparative Examples 1 and 2 without stress control film.

What is claimed is:
1. A piezoelectric device comprising:
a first electrode film;
a piezoelectric film provided on the first electrode film, the piezoelectric film being made of PZT (lead zirconate titanate), KNN (potassium sodium niobate), BT (barium titanate), LN (lithium niobate), BNT (bismuth sodium titanate), ZnO (zinc oxide), or AlN (aluminum nitride);
a second electrode film provided on the piezoelectric film, the second electrode film being made of palladium (Pd), platinum (Pt), rhodium (Rh), gold (Au), ruthenium (Ru), iridium (Ir), molybdenum (Mo), titanium (Ti), or tantalum (Ta), and
a second stress control film provided on the second electrode film, the second stress control film being made of inorganic materials selected from Pd, Co, Ni, Au, Cu, Ag, and Ti; alloys composed of elements selected from Ni, Fe, Co, Cr, Al, and Mg; or inorganic oxides selected from $Nb_2O_5$, $Y_2O_3$, $TiO_2$, MgO, BaO, CaO, and SrO,
wherein the second stress control film is in direct contact with the second electrode film, and
wherein a linear expansion coefficient of the second stress control film is larger than linear expansion coefficients of the second electrode film and the piezoelectric film.
2. The piezoelectric device according to claim 1, wherein the second stress control film is an inorganic oxide.
3. The piezoelectric device according to claim 1, wherein a top surface of the second stress control film and a bottom surface of the first electrode film are exposed.
4. The piezoelectric device according to claim 1, further comprising:
a first stress control film provided on a bottom surface of the first electrode film,
wherein the first stress control film is in direct contact with the first electrode film, and
wherein a linear expansion coefficient of the first stress control film is larger than linear expansion coefficients of the first electrode film and the piezoelectric film.
5. The piezoelectric device according to claim 4, wherein the first stress control film is an inorganic oxide.
6. The piezoelectric device according to claim 4, wherein a top surface of the second stress control film and a bottom surface of the first stress control film are exposed.
7. The piezoelectric device according to claim 1, wherein:
the piezoelectric film is made of KNN, PZT or BT,
the second electrode film is made of Pt or Mo and
the second stress control film is made of Pd, Co, Ni, SrO or MgO.
8. The piezoelectric device according to claim 7, wherein:
the piezoelectric film is made of KNN,
the second electrode film is made of Pt, and
the second stress control film is made of Pd.
9. The piezoelectric device according to claim 7, wherein:
the piezoelectric film is made of KNN
the second electrode film is made of Pt, and
the second stress control film is made of Co.
10. The piezoelectric device according to claim 7, wherein:
the piezoelectric film is made of KNN
the second electrode film is made of Pt, and
the second stress control film is made of Ni.
11. The piezoelectric device according to claim 7, wherein:
the piezoelectric film is made of KNN
the second electrode film is made of Pt, and
the second stress control film is made of Au.

12. The piezoelectric device according to claim 7, wherein:
the piezoelectric film is made of KNN
the second electrode film is made of Pt, and
the second stress control film is made of Cu.

13. The piezoelectric device according to claim 7, wherein:
the piezoelectric film is made of KNN
the second electrode film is made of Pt, and
the second stress control film is made of MgO.

14. The piezoelectric device according to claim 7, wherein:
the piezoelectric film is made of KNN
the second electrode film is made of Pt, and
the second stress control film is made of SrO.

* * * * *